US005358909A

United States Patent [19]

Hashiguchi et al.

[11] Patent Number: 5,358,909

[45] Date of Patent: Oct. 25, 1994

[54] METHOD OF MANUFACTURING FIELD-EMITTER

[75] Inventors: Gen Hashiguchi; Satoshi Kanazawa; Kazuhiko Kawamura; Hikaru Sakamoto, all of Kawasaki, Japan

[73] Assignee: Nippon Steel Corporation, Tokyo, Japan

[21] Appl. No.: 840,896

[22] Filed: Feb. 26, 1992

[30] Foreign Application Priority Data

Feb. 27, 1991 [JP] Japan .................................. 3-56075
Oct. 22, 1991 [JP] Japan .................................. 3-302353

[51] Int. Cl.[5] .......................................... H01L 21/465

[52] U.S. Cl. .................................. 437/228; 437/250; 437/927; 156/641; 156/657; 156/643

[58] Field of Search ............... 156/657, 647, 632, 641; 437/228; 303/309, 313, 336

[56] References Cited

U.S. PATENT DOCUMENTS

| | | | |
|---|---|---|---|
| 3,970,887 | 7/1976 | Smith et al. | 313/309 |
| 4,168,213 | 9/1979 | Hoeberechts | 156/659 |
| 4,307,507 | 12/1981 | Gray et al. . | |
| 4,685,996 | 8/1987 | Busta et al. | 156/628 |
| 4,916,002 | 4/1990 | Carver | 156/651 |
| 5,090,932 | 2/1992 | Dieumegard et al. | 437/89 |
| 5,100,355 | 3/1992 | Marcus et al. | 156/647 |
| 5,201,992 | 4/1993 | Marcus et al. | 156/643 |

OTHER PUBLICATIONS

R. B. Marcus et al, "Formation of Silicon Tips with 4 nm Radius", *Applied Physic Letters,* vol. 56, No. 3, 15 Jan., 1990, pp. 236–238.

H. Umimoto et al, "Numerical Simulation of Stress–Dependent Oxide Growth at Convex and Concave Corners of Trench Structures", IEEE Electron Device Letters, vol. 10, No. 7, Jul. 1989 pp. 330–332.

S. M. Zimmerman et al, "Development Progress Toward the Fabrication of Vacuum Microelectronic Devices Using Conventional Semiconductor Processing", 1990 IEDM pp. 163–165.

*Primary Examiner*—Tom Thomas
*Assistant Examiner*—Michael Trinh
*Attorney, Agent, or Firm*—Cushman, Darby & Cushman

[57] ABSTRACT

A field-emitter having stable electrical properties, a long service life and a very small electron emission voltage is provided. The cathode of the element has a strongly sharpened projection at the tip end, and a smooth connection between the projection and the body portion. In the method of manufacturing the elements, cathodes are produced with a high reproducibility by using a mold produced by forming concave portions in the silicon and oxidizing the layer thereon, whereby the spacing between the cathode and the gate electrode is determined by the thickness of the silicon oxide layer, and the position of the cathode is determined by the silicon oxide layer embedded in the silicon substrate, by using an etching stop method based on an electrochemical etching process.

3 Claims, 13 Drawing Sheets

METHOD OF MANUFACTURING FIELD-EMITTER

BACKGROUND OF THE INVENTION

1. Field of the Invention

The present invention relates to a field-emitter used in a scanning electron microscope or a cathode ray tube, and to a method of producing same.

Increasing research is being made, into micro field-emitters formed on a silicon or glass substrate by utilizing the technology used for manufacturing integrated circuits. The application of the micro-field emitter extends to vacuum tube integrated circuits including an array of vacuum triodes, each composed of a cathode, control electrode and anode, as well as a flat display panel in which cathodes are arranged in a plane and a fluorescent element faces the plane. New advances, therefore, can be expected in this field, and the present invention deals with such a field emitter and a method of producing same.

2. Description of the Related Art

Field-emitters and methods of producing same are known as Gray's method from U.S. Pat. No. 4,307,507 issued on Dec. 29, 1981, and from S.M. Zimmerman, D.B. Colavith and W.T. Babie; Development Progress Toward The Fabrication of Vacuum Microelectronic Devices Using Conventional Semiconductor Processing (Proceedings of IEDM 90, pp. 163–166 (1990)).

The field-emitter cathode and method of manufacturing same developed by Gray et al., are first elucidated. This method is based on the technique whereby one or more very small holes are formed in an etching mask deposited on a silicon single crystal substrate, and the substrate then etched with an anisotropic etching which assures different etching rates according to differences in the crystal orientation, to thereby obtain etched holes having a sharpened bottom tip, with a high reproducibility. For example, when a (100) substrate is etched with an aqueous solution of potassium hydroxide, etched holes in the form of quadrangular pyramid are formed, and thereafter, a cathode material is deposited on the silicon single crystal substrate having the above-described etched holes, to form a thin film thereon. In this case, the film of cathode material may be formed after forming a protective layer on the silicon single crystal substrate. Finally, the cathode is produced by removing, by an appropriate etching, the silicon single crystal substrate utilized as a mold. This method gives quadrangular pyramid-shaped cathodes.

Further, a method of manufacturing microtriodes by S.M. Zimmerman et al is elucidated; FIG. 1 shows the section of an element in the respective stages of manufacture thereof.

As shown in FIG. 1A, a single crystal silicon substrate 23 is oxidized to form an silicon oxide layer 19, and then a silicon nitride layer 20 and polysilicon layer 21 forming a gate electrode are successively deposited.

As shown in FIG. 1B, an opening 22 approximately 2 $\mu m \times 2$ $\mu m$ square is formed, and the silicon nitride layer 20 and silicon oxide layer 19 are etched through the opening 22.

As shown in FIG. 1C, a silicon oxide layer 27 is deposited over the whole surface of the substrate, by a low pressure chemical vapor deposition method (LPCVD method), whereby an inversed cone is formed at the opening in the silicon oxide layer, and subsequently, a polysilicon layer 24 is formed on the whole surface of the substrate by the LPCVD method, as shown in FIG. 1D. In this case, a cathode 26 in the form of the inversed cone is formed at the inversed cone-shaped mold in the silicon oxide layer. Furthermore, as shown in FIG. 1E, an opening 25 is formed, in the vicinity of the cathode 26 made of poly-silicon, in the poly-silicon layer. Finally, a microtriode is produced with a space formed by etching the silicon oxide layer deposited in the initially formed opening 22 through the opening 25.

Nevertheless, several problems arise in the above-described prior arts. Namely, the method of Gray et al., provides a high reproducibility in the shape of the cathode, since the mold is formed by anisotropically etching silicon single crystal, but difficulties remain with the sharpening of the tip of the cathode, with finely fabricating the element, and with forming the control electrode close to the cathode. Furthermore, the edge angle of the cathode tip obtained by this method is determined by the angle of the crystallographic surface obtained by the etching, and this makes it difficult to sharpen the angle of the cathode tip, and thus it becomes impossible to reduce the voltage of the electron emission.

In the method of manufacturing microtriodes proposed by S.M. Zimmerman et al., a mold formed at the opening 22 in the silicon substrate 23, on which the silicon oxide layer 27 is deposited by the LPCVD method, changes the shape and size of the opening 22, depending on the conditions for forming the silicon oxide layer 27, and the thickness of the layer, causing a lower reproducibility of the shape formed. As a result, a high reproducibility of the radius of curvature cannot be obtained for the tip of the produced cathode 26. Moreover, it is difficult to control the position of the cathode tip, due to the change in the shape of the mold. Also, the spacing between the single crystal cathode 26 and substrate 23 for the anode electrode, as well as the mutual relationship between the cathode 26 and polysilicon layer 21, cannot be controlled, and accordingly, the voltage of the electron emission and the electron travelling time changes from element to element. Further, a problem arises with the stability of the electric properties. Namely, the cathode produced by this method has an increased resistivity due to the reduced angle of inclination in the main body, resulting in a destruction of the cathode itself by the Joule's heat.

Therefore, the object of the present invention is to provide a field-emitter ensuring stable electrical properties and a lower electron emission voltage by producing a cathode including a projection having a reduced inclination angle of the tip thereof, and by controlling the positional relationship between the cathode and anode and/or gate, and to provide a method of manufacturing an emitter having the same properties, with a high reproducibility.

SUMMARY OF THE INVENTION

According to the present invention, there is provided a method of manufacturing a field-emitter cathode having a sharp point at a tip thereof, the method comprising the steps of (a) providing a substrate having a silicon layer at least adjacent to a top surface of the substrate, (b) forming an insulating layer on the silicon layer; (c) etching a portion of the silicon layer and the insulating layer to form a recess in the silicon layer, the recess having a cross section the sides of which intersect and form a sharp point at a bottom thereof, the silicon layer having a surface in the recess, (d) oxidizing a portion of the silicon layer in the recess to form a first silicon oxide layer at least on the surface of the recess of the silicon layer, (e) depositing an electrically conductive layer on the first silicon oxide layer in the recess, the electrically conductive layer having a sharp point at the bottom of the recess, the electrically conductive layer extending to the insulating layer in an area above at least a portion of the silicon layer surrounding the recess, and (f) removing at least a portion of the first silicon oxide layer in the recess to thereby expose the sharp point of the electrically conductive layer.

There is also provided a method of manufacturing a vacuum microelectronic triode device, the method comprising the steps of (a) providing a substrate having a silicon layer at least adjacent to a top surface of the substrate, the silicon layer having a top surface, (b) forming a recess in the silicon layer from the top surface thereof, the recess having a cross section the sides of which intersect and form a sharp point at a bottom thereof, the silicon layer having a surface in the recess, (c) oxidizing a portion of the silicon layer in the recess to form a first silicon oxide layer on the surface of the recess of the silicon layer, (d) etching the silicon layer surrounding the first silicon oxide layer to a depth shallower than a depth of the bottom of the first silicon oxide layer, the etched silicon layer having a second top surface, (e) oxidizing the second surface of the silicon layer to form a second silicon oxide layer, (f) depositing a first electrically conductive layer on the first and second silicon oxide layers, (g) depositing a third silicon oxide layer on the first electrically conductive layer, (h) etching a portion of the third silicon oxide layer above said recess to form a first opening on the first electrically conductive layer, (i) depositing a second electrically conductive layer on the first opening and the third silicon oxide layer, (j) etching a portion the second electrically conductive layer to form a second opening of on the second electrically conductive layer on the third silicon oxide layer remote from the first opening, (k) etching a portion of the third, first and second silicon oxide layers through the second opening to expose the first electrically conductive layer including the sharp point thereof on the recess, and (l) closing the second opening with a protective layer under a vacuum.

There is further provided a method of manufacturing a field emitter cathode having a sharp point at a tip thereof, the method comprising the steps of (a) providing a substrate, (b) forming a stack of a first insulating layer, a first electrically conductive layer and a second insulating layer in this order on the substrate, (c) forming an opening in said stack to expose the substrate, (d) depositing a silicon layer in the opening and on the second insulating layer, (e) oxidizing the silicon layer to form a silicon oxide layer having a recess the sides of which intersect and form a sharp point at the bottom thereof, (f) depositing a second electrically conductive layer on the silicon oxide layer, the second electrically conductive layer having a sharp point in the recess of the silicon oxide layer, and (g) removing at least a portion of the silicon oxide layer to expose the sharp point of the second electrically conductive layer.

There is furthermore provided a method of manufacturing a vacuum microelectronic triode device, the method comprising the steps of, (a) providing a silicon substrate, (b) forming a stack of a first insulating layer, a first electrically conductive layer and a second insulating layer in this order on the silicon substrate, (c) forming a first opening in said stack to expose the substrate, (d) depositing a silicon layer in the first opening and on the second insulating layer, (e) oxidizing the silicon layer to form a silicon oxide layer having a recess the sides of which intersect and form a sharp point at the bottom thereof, (f) patterning the silicon oxide layer to leave a portion of the silicon oxide layer including an area on the first opening and to expose a portion of the second insulating layer, (g) depositing a second electrically conductive layer on the patterned silicon oxide layer and the exposed second insulating layer, the second electrically conductive layer having a sharp point in the recess of the silicon oxide layer, (h) forming a second opening in the second electrically conductive layer remote from the first opening, (i) etching and removing the silicon oxide layer through the second opening to expose the sharp point of the second electrically conductive layer and (j) closing the second opening with a protective layer in a vacuum.

DESCRIPTION OF THE PREFERRED EMBODIMENTS

The field-emitter cathode of the present invention is composed of a main body having an increased angle of inclination, to suppress a heating of the cathode due to Joule's heat and thereby prevent the destruction of the cathode, a change in shape thereof, and a deterioration of the degree of vacuum due to a desorption of the adsorbed molecules. The tip of the cathode is a projection having a small inclination angle, thereby lowering the electron emission voltage due to the electric field concentrated around the tip. With the lowering of the emission voltage, the energy of the emitted electrons can be lowered, thus preventing a breakage of the cathode due to a discharge of gaseous molecules in vacuum. Moreover, an abrupt increase in the resistance can be successfully suppressed in the vicinity of the tip, by a smooth and tangential connection between the projection and the main body.

The method of producing the microtriode will now be described. An insulating film having holes is formed on the crystallographic plane (100) of an Si substrate, and then the silicon single crystal is etched with an anisotropic etching such as an aqueous solution of potassium hydroxide, hydrazine, or the like, whereby rectangular cone shaped cavities are obtained with a high reproducibility, since the cavities are bound by (111) surfaces having a very slow etching rate. The dimension of the rectangular cone, i.e., the width and height, can be controlled by the size of the opening in the insulating film, and the mold for the cathode is then formed by oxidizing the cavities. When a silicon is thermally oxidized in an oxidizable atmosphere of oxygen or water vapor, stress arises in the oxide film formed by oxidation and the interfaces between the silicon and the oxide film in the vicinity of the depression, and due to this stress, the reduction in the etching rate and/or the visco-elastic flow of the oxide film occur in the vicinity of the tip of the depression, and the film thickness is reduced as it draws closer to the tip end, thus giving rise to a deep depression therein (see, H. Umimoto, S. Odanaka, I. Nakano: Numerical Simulation of Stress-dependent Oxide Growth at Convex and Concave corners of Trench Structures, IEEE, Electron Device Letters, Vol. 10, No. 7, 1989, pp. 330–332).

Figure 1A:
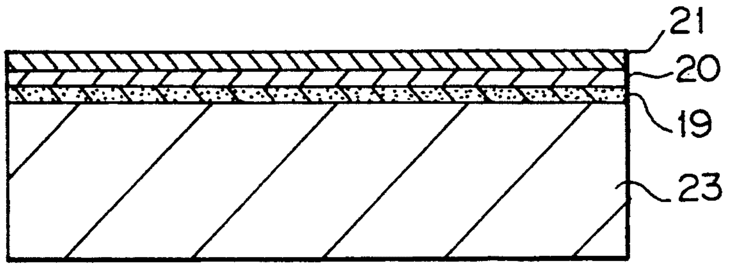
PRIOR ART Fig. 1A
FIGS. 1A–1E illustrate section views of a conventional field-emitter element of a microtriode and a method for producing the same.
Figure 1B:
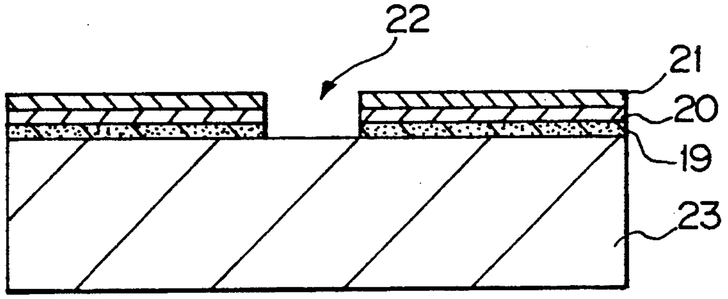
PRIOR ART Fig. 1B
Figure 1C:
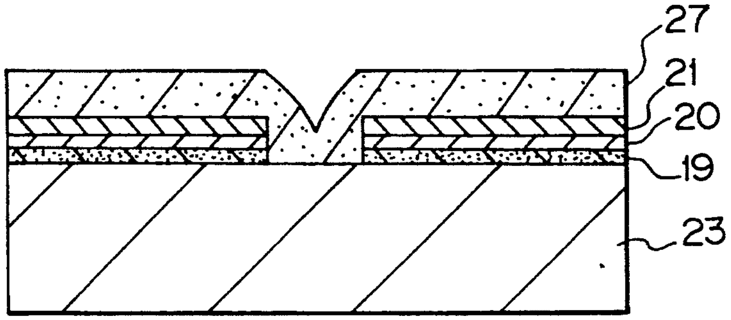
PRIOR ART Fig. 1C
Figure 1D:
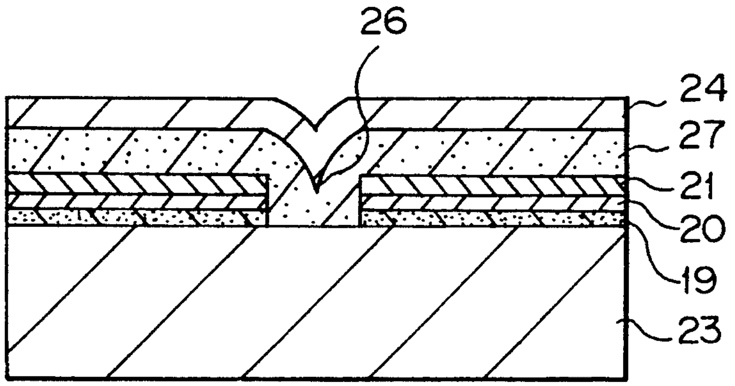
PRIOR ART Fig. 1D
Figure 1E:
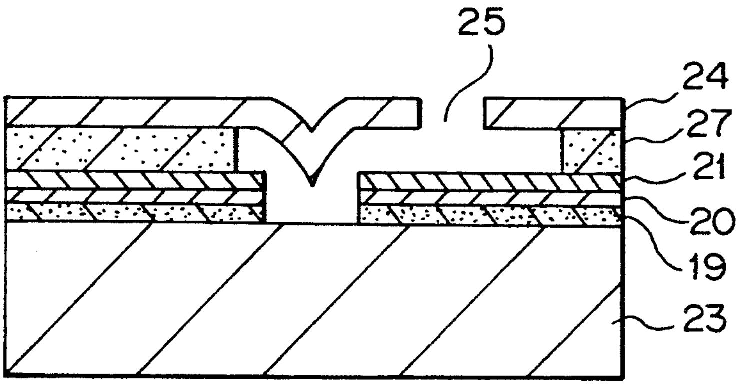
PRIOR ART Fig. 1E
Figure 2:
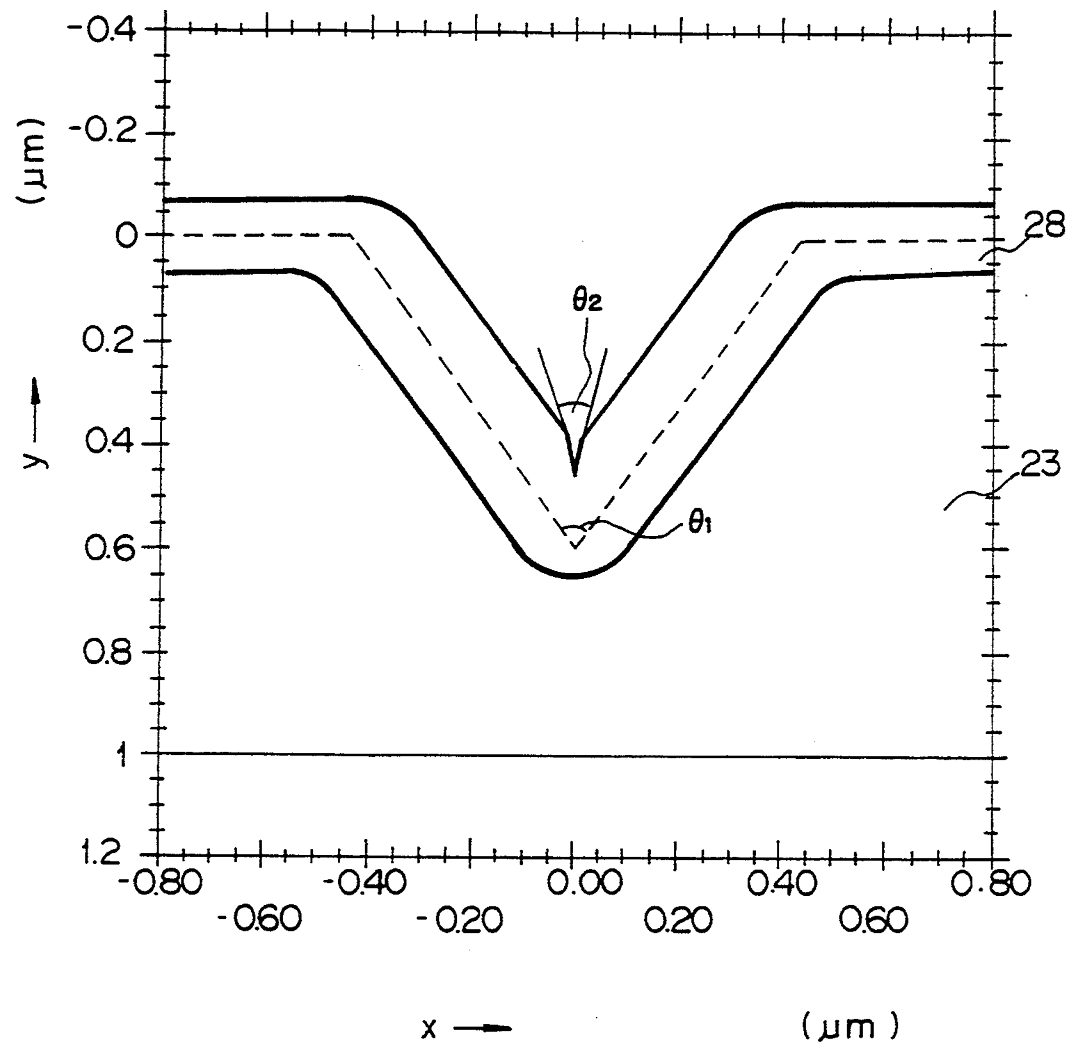
FIG. 2 is a section view of a field-emitter element illustrating the formation of a silicon oxide layer in an inverse pyramid-shaped depression.

FIG. 2 shows the results of the computer simulation of the above-described mentioned shape. The broken line in the drawing indicates the position of the silicon surface prior to the oxidization. The cone angle $\Theta_2$ at the tip end of the silicon oxide film 28, which is formed by thermally oxidizing the silicon single crystal having V shaped grooves, becomes smaller than the cone angle $\Theta_1$ of the initial grooves, thereby enabling grooves having a sharper cone angle to be produced. The silicon oxide film 28 can be used as a mold when forming the cathode by depositing a cathode material on the grooves and later removing the silicon oxide film 28 by an aqueous solution of hydrofluoric acid. Accordingly, a very small cathode having an extremely sharpened tip can be obtained.

After the above-described cavities are locally oxidized, the insulating film is removed and the silicon single crystal is etched in the vicinity of the cavity by a depth of several micrometers from the surface, by a silicon etchant of an aqueous solution of potassium hydroxide, ethylene diamine pyrocatechol, hydrazine or the like. This etching depth determines the mutual difference in the height of the gate electrode and of the cathode. An pn junction is formed, by doping impurities having an inverse conductivity to that of the substrate or a layer in which impurities are doped in a high concentration is formed down to the etching depth in the silicon substrate. The accuracy and the reproducibility of the etching depth can be enhanced by using an electrochemical etching stop technique, through the pn junction, or by using an etching stop technique based on the dependence of the etching rate on the concentration of impurities. The silicon etching provides the formation of a step around the cavities, and therefore, when a material of the cathode and gate electrode is deposited by a vacuum evaporation or sputtering method, the material is electrically insulated by the step above and around the cavity, and at the same time, the cathode and gate electrode are formed. Further, the gate electrode is automatically disposed at the position apart from the tip end of the cathode, by the thickness of the oxide film above the cavity.

A silicon oxide film and silicon nitride film are successively deposited onto the electrode material by the vacuum evaporation or sputtering technique, and a hole is formed through both the silicon oxide layer and silicon nitride layer, in the vicinity of the cathode. The silicon oxide layer is further etched through the hole, by an aqueous solution of hydrofluoric acid, to thereby expose the cathode after removing the silicon oxide under the cathode. Finally, the air in a gap caused by the above-described hole is evacuated therethrough, and the hole then closed by depositing a silicon oxide layer with the vacuum evaporation method. As a result, a microtriode having an silicon substrate anode electrode and an evacuated space in the substrate is formed.

The present invention provides a field emitter having a low electron emission voltage and stable electrical properties, with a high reproducibility.

EXAMPLE 1

The first embodiment of the present invention will now be described with reference to the drawings. In all the drawings, the same reference numbers are used for elements having the same function.

Figure 3:
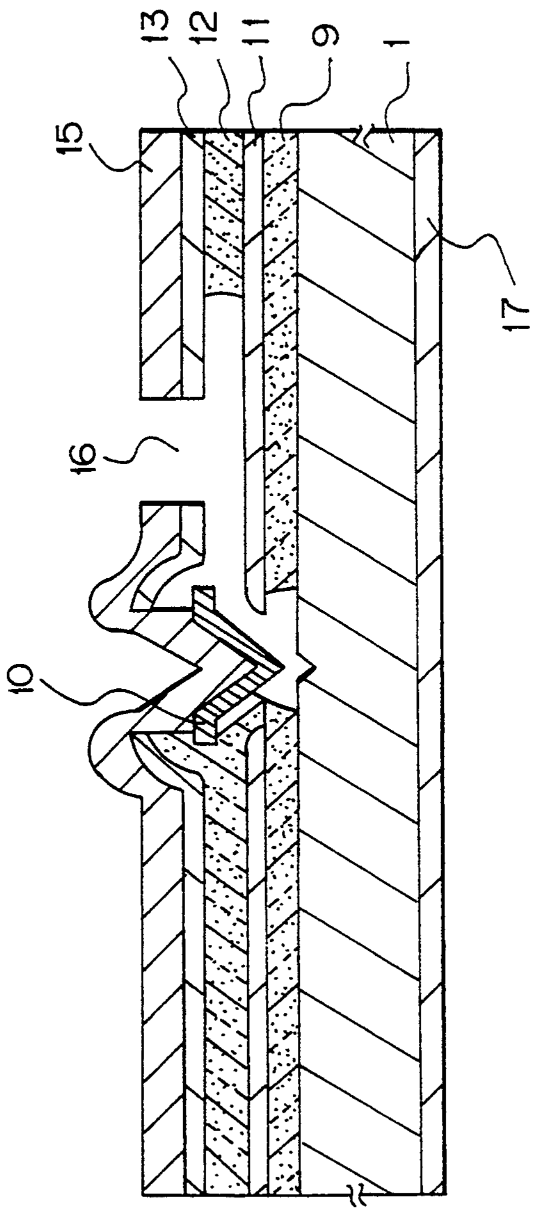
FIG. 3 is a section view of a field-emitter element illustrative of a first embodiment of the present invention.

First, the process for manufacturing a microtriode in the first embodiment of this invention is described. FIG. 3 shows a section of the microtriode of the first embodiment of the present invention. An Si substrate 1 is a single crystal having a (100) surface; an n-type substrate is used when employing the electro-chemical etching stop for etching the silicon substrate, whereas either an n- or p-type substrate may be used according to intention when employing the other etching stop method. In this example, an n-type substrate having a specific resistivity of 0.8 to 1.2 Ωcm was used. The silicon oxide layer 9 is an insulating film interposed between the gate electrode 11 and the Si substrate 1, and having a thickness of, e.g., 500 nm. A cathode 10 for an electron emission gun is formed simultaneously in conjunction with the process for forming the corresponding layer 11 for a gate electrode. Any kind of the material can be used for the cathode as long as it is not affected by an aqueous solution of hydrofluoric acid to be used to underetch the silicon oxide film, and the material used is generally determined by taking into consideration the electron emission ability, stability and other factors thereof. In this example, a molybdenum layer having a thickness of 500 nm was used. The layer for the gate electrode has the same material and the same thickness as those for the cathode, as described above; A molybdenum layer having a thickness of, e.g., 500 nm was used as a layer for the gate electrode. The silicon oxide layer 12 is an insulating layer interposed between the gate electrode layer 11 and cathode 10, and having a thickness of, e.g., 700 nm. A silicon nitride layer 13 serves as a protective layer when etching the silicon oxide layer, and has a thickness of, e.g., 300 nm. The material of the electrode layer 15 for the cathode is advantageously selected from those not affected by an aqueous solution of hydrofluoric acid, and the thickness thereof must be determined such that it comes into firm contact with the cathode 10. The size of etching hole 16, which is used to underetch the silicon oxide 9, the silicon oxide 12 and the silicon oxide for a mold of the field emission gun, mentioned later, must be determined such that the etchant of the aqueous solution of hydrofluoric acid can be easily exchanged therein. The spacing between the etching hole 16 and cathode 10 is preferably as short as possible, but is determined by taking into account the error of matching masks during the lithography patterning. The number of holes is usually one or more for each cathode. In some layouts, a corresponding hole can be used for several cathodes. In practice, an etching hole having a 2 μm square area was formed apart from the cathode 10 by 2 μm. The material of the metallic layer 17 for the anode electrode must be selected from those capable of coming into ohmic contact with the Si substrate 1.

In practice, an In layer of 200 nm and Au layer of 300 nm were used.

With reference to FIGS. 4A–4M, the successive stages of the method of manufacturing the above-mentioned microtriode will now be described.

Figure 4A:
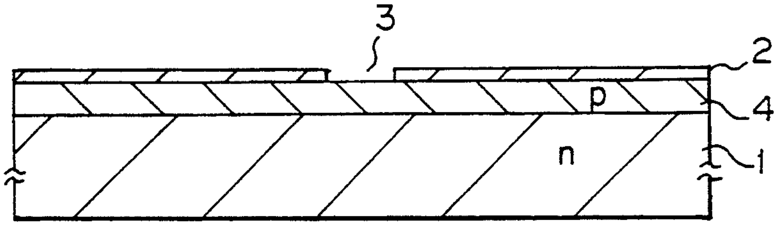
FIGS. 4A–4M are section views illustrative of the process of developing the first embodiment.

P-type layer 4 having a thickness of 1 μm is formed by the epitaxial growth method on the n-type (100) Si substrate, as shown in FIG. 4A. A silicon nitride layer 2 is then deposited on the layer 4 by, for example, an LPCVD, sputtering or plasma CVD method. The thickness of the silicon nitride 2 should be thick enough to be used as a mask in the LOCOS oxidization described later. The thickness of the silicon nitride used is 300 nm.

Figure 4B:
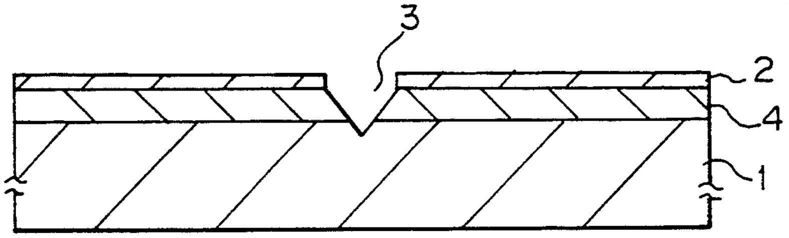

Thereafter, a hole 3 is formed in the silicon nitride layer 2 by photo-lithography. The reactive ion etching technique preferably can be utilized for etching the silicon nitride 2, but a heated phosphoric acid also can be used. The size of the opening 3 determines the lateral dimension of the inverse pyramid shaped cavity formed at the area of the opening 3, as shown in FIG. 4B. On the other hand, the depth of the cavity is preferably determined to be approximately the total thickness of silicon oxide 9, gate layer 11 and silicon oxide 12, to assure an easy contact of the cathode 10 with the electrode layer 15, as described later. The actual size of the opening 3 is determined from the above-described conditions, and is 2 μm square in this example.

Figure 4C:
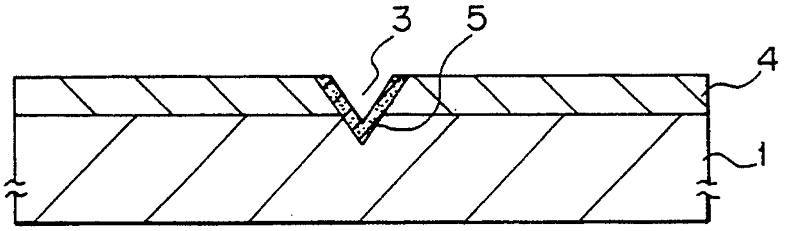

In the next stage, the silicon substrate 1 is etched anisotropically with an aqueous solution of KOH, through the above-mentioned opening 3 as shown in FIG. 4B. This etching stops when all the side surfaces of the opening in the silicon substrate to be etched become (111) surfaces. Thereafter, the surfaces of the silicon substrate thus exposed with the aqueous solution of KOH are thermally oxidized to form a silicon oxide layer 5, as shown in FIG. 4C, wherein the above-described silicon nitride layer 2 serves as a mask for the other portions, and therefore, only the silicon substrate restricted by the area of the opening 3 is oxidized. The thickness of the silicon oxide 5 is, e.g., 500 nm.

The silicon nitride layer is then removed by etching with a heated phosphoric acid. This process provides a preferable formation of a silicon oxide layer at the area of the opening 3, and the silicon substrate 1 is exposed at all other portions, as shown in FIG. 4C.

Figure 4D:
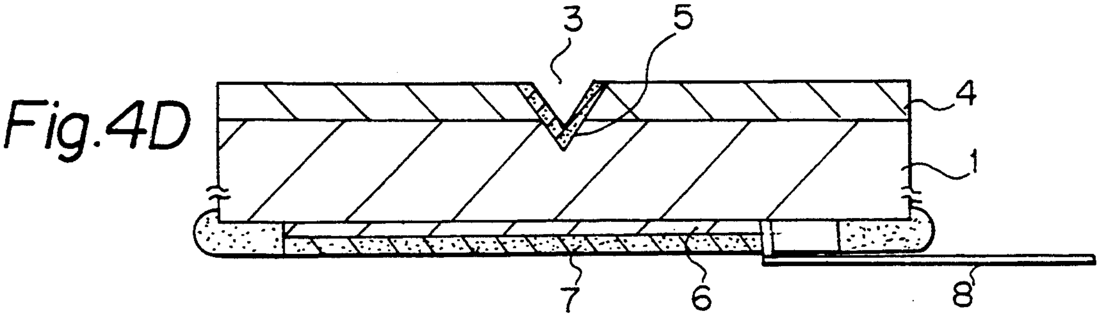

Thereafter, an electrode layer 6 is deposited on the reverse side of the silicon substrate 1, by a deposition method, e.g., vacuum evaporation method, as shown in FIG. 4D. The material for the layer can be selected such that it is in the ohmic contact with the silicon substrate 1. In this example, the layer is a double layer of In (200 nm) and Au (300 nm). In the next stage, a lead wire 8 covered by a material, e.g., vinyl, unaffected by the aqueous alkaline liquid, is bonded with a conductive material, e.g., silver paste, to the metal layer 6, and then the metal layer 6 and n-type areas of silicon substrate 1 are entirely covered with a guard layer 7 not affected by an aqueous alkaline solution.

In the next process, the silicon substrate 1 is etched in the aqueous solution of KOH by applying a positive potential of approx. 1 V relative to an electrode therein to the lead wire 8. In this etching, n-type portion of the silicon substrate cannot be etched, due to the positive applied voltage, but p-type area can be easily etched. Accordingly, the etching is automatically stopped after all of the p-type area is completely etched. The etching rate for the silicon oxide layer in the aqueous solution of KOH is extremely slow, compared with that for the silicon substrate, and thus the silicon oxide layer 5 remains unetched when etching the silicon substrate 1.

Figure 4E:
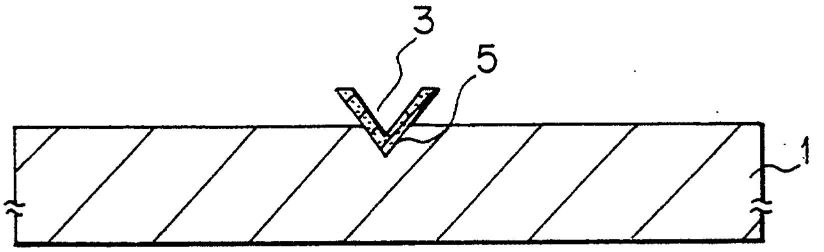

After the p-type layer 4 is etched, a guard layer 7, lead wire 8 and electrode layer 6 are removed by an aqua regia and an organic solvent such as acetone, and thus the structure shown in FIG. 4E is obtained.

Figure 4F:
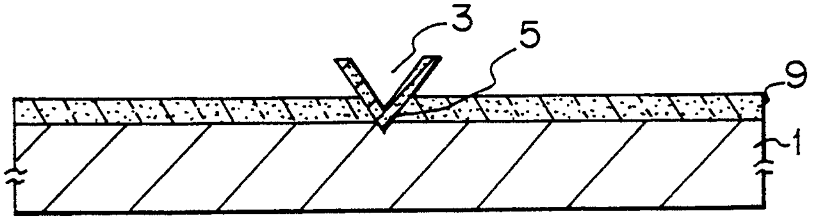
Figure 4G:
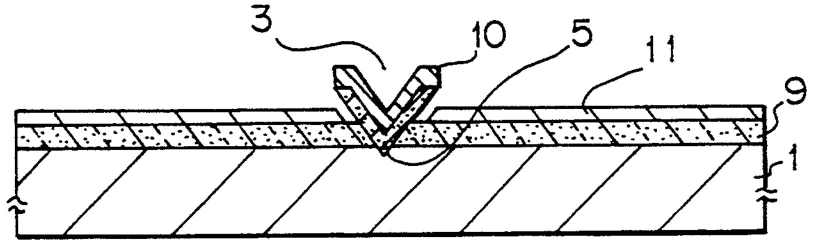

A silicon oxide layer 9 is formed by a thermal oxidation method, as shown in FIG. 4F, and then a gate layer 11 and cathode 10 are formed by a deposition method, e.g., vacuum evaporation method, as shown in FIG. 4G. As a material for the gate layer 11 and cathode 10, a metal, metal alloy or semiconductor can be selected, and as the deposition method, sputtering also can be employed.

The gate layer 11 can be advantageously formed by an oblique incidence of atoms to the silicon substrate 1, using a planetarium type evaporator, in which case the gate layer reaches the under portions of the mold for the inverse pyramid shaped cathode formed by silicon oxide layer 5, and thus a function favorable for a triode can be obtained. In this example, the gate layer 11 and cathode layer 10 are prepared with a planetarium type vacuum evaporator. Furthermore, the gate layer 11 can be structured with a patterning mask, as required.

Figure 4H:
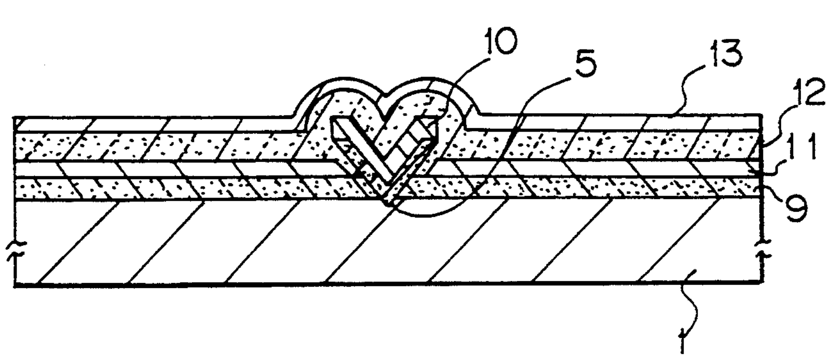

Thereafter, a silicon oxide layer 12 and silicon nitride layer 13 are formed by an LPCVD, plasma CVD or sputtering method, as shown in FIG. 4H. In this example, either the silicon oxide layer 12 or silicon nitride layer 13 is prepared by the sputtering method.

Figure 4I:
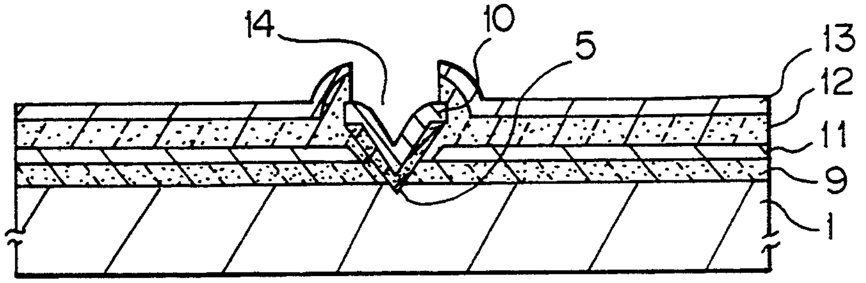

In the next step, an opening 14 is formed above the cathode 10, as shown in FIG. 4I. In this preparation, a photoresist is applied to the whole surface of the substrate by spinning, and a uniform thickness of the photoresist is obtained due to a self-planarization action. After baking, the whole surface is further etched in a $CF_4$ gas by the reactive ion etching method, and thus the opening 14 can be formed only at the portion where the cathode 10 is self-aligned. Note, convex areas are generally etched to a greater extent in the reactive ion etching, since the convex areas in the spin application of the photoresist have a much smaller thickness of the resist than the other areas. Accordingly, the areas in the vicinity of the cathode 10 are rapidly etched, thereby revealing the silicon nitride layer 13 to start the etching in advance; the opening 14 is formed by this procedure. Nevertheless, it is possible to form the opening 14 by structuring the resist by a lithographic patterning.

Figure 4J:
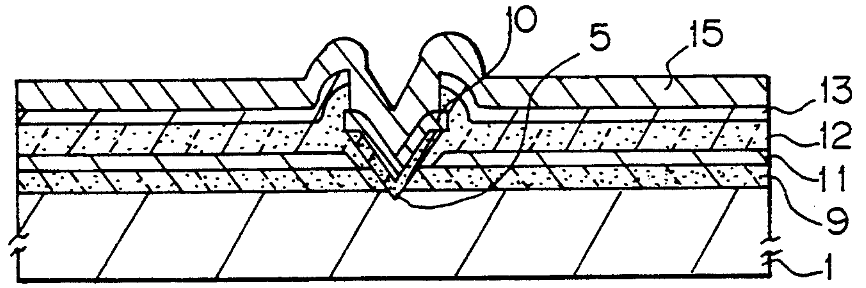
Figure 4K:
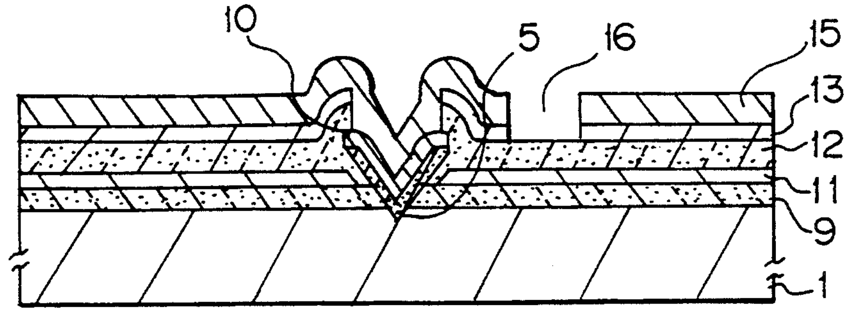
Figure 4L:
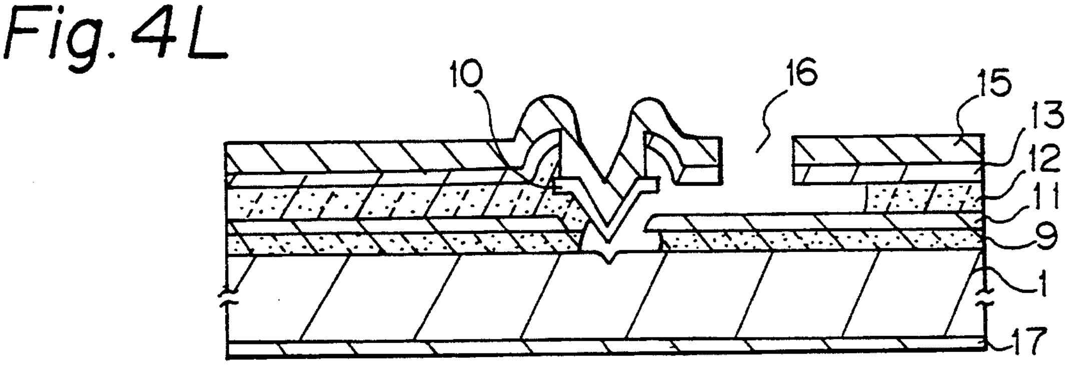
Figure 4M:
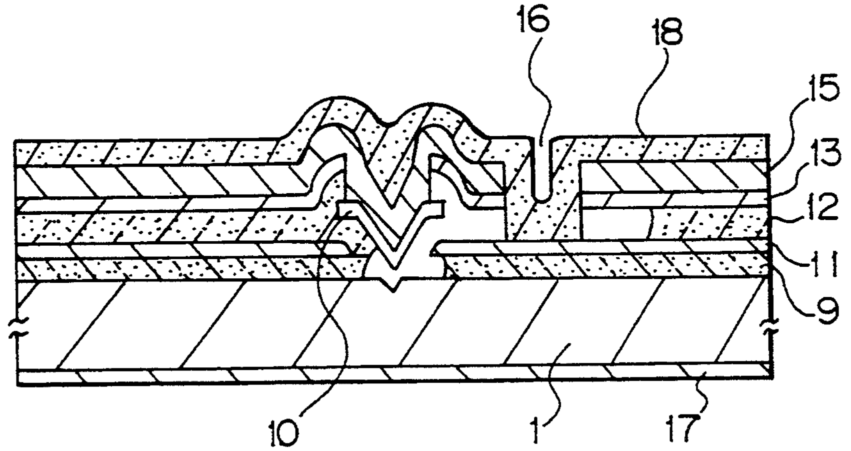

In the next step, an electrode layer 15 is formed and given a necessary pattern, as shown in FIG. 4J. Subsequently, a hole 16 is formed in both the electrode layer 15 for the cathode and the silicon nitride 13 by a photolithograpy and reactive ion etching technique. Thereafter, respective parts of the silicon oxide layers 12, 5 and 9 are etched. The silicon oxide layers 5 and 9 must be etched at least down to the tip end of the cathode 10. In the next step, an electrode layer 17 for an anode is formed at the back of the silicon substrate, as shown in FIG. 4L. Finally, an insulating layer 18, in this example, a silicon oxide layer, is deposited by the vacuum evaporation method to fill the hole with the silicon oxide and thereby form a microtriode encapsuled in vacuum, as shown in FIG. 4M. Therefore, the microtriode thus obtained can be utilized in atmosphere without a specific vacuum apparatus.

As a result, microtriode having a very small radius of curvature at the end of the tip and preserving a high accuracy of the mutual relationship between the electrodes can be successfully produced.

EXAMPLE 2

The method of manufacturing cathodes in the second embodiment of this invention is now elucidated with reference to FIGS. 5A to 5E, where in a section of the field-emitter element is illustrated.

Figure 5A:
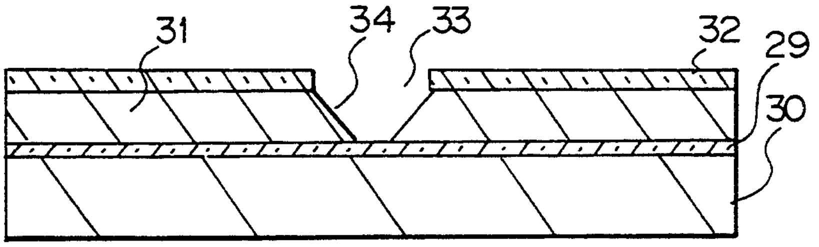
FIGS. 5A–5E are section views illustrative of a process according to a second embodiment of the present invention.

FIG. 5A shows the first step of the method. An application agent for diffusing phosphorus is applied to the surface of an n-type (100) SIMOX (separation by implanted oxygen) silicon substrate 30 prepared by forming a first silicon oxide layer 29 having a thickness of 200 nm at a depth of 1 μm from the silicon surface, and the substrate 30 is baked for 30 min. in a nitrogen atmosphere at 150° C., and further treated for diffusion in a nitrogen atmosphere at 900° C. for 2 hrs, whereby an n-type conductive layer is formed on the first silicon oxide layer 29, to thus obtain a gate layer 31. Further, a silicon nitride layer 32 having a thickness of 300 nm is formed by the LPCVD method, and then an opening 33 of 2 μm square area is formed in the silicon nitride layer 32 by photolithography. Thereafter, the silicon substrate 30 is etched through the opening 33 with an aqueous solution of potassium hydroxide. The etching is stopped when the (111) surface 34 appears because the etching speed is extremely low for the surface.

Figure 5B:
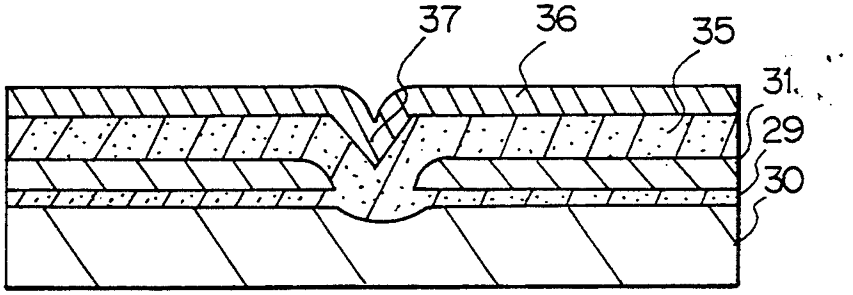

The second step of this method is shown in FIG. 5B. After the etching, silicon nitride layer 32 is completely removed with a solution of phosphoric acid heated at approx. 150° C., and then the silicon substrate 30 is oxidized at 1000° C. in a steam atmosphere, to thereby form a second silicon oxide layer 35 having a thickness of 1 μm. Subsequently, a tungsten layer 36 having a thickness of 1 μm is deposited by the vacuum evaporation method to form a cathode 37.

Figure 5C:
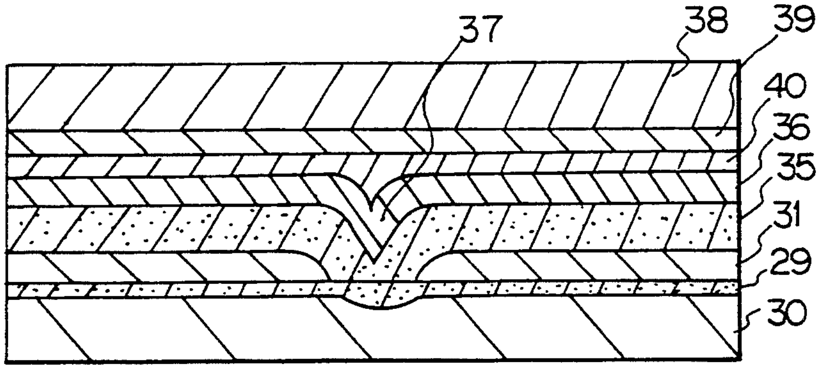

The third step of this method is shown in FIG. 5C. A transparent conductive layer (indium tin oxide (ITO) layer) 39 having a thickness of 1 μm is deposited on a glass substrate 38 by the vacuum evaporation method, and then the transparent conductive layer 39 on the glass substrate 38 is bonded to the tungsten layer 36 on the silicon substrate 30 with a silver-epoxy resin 40.

Figure 5D:
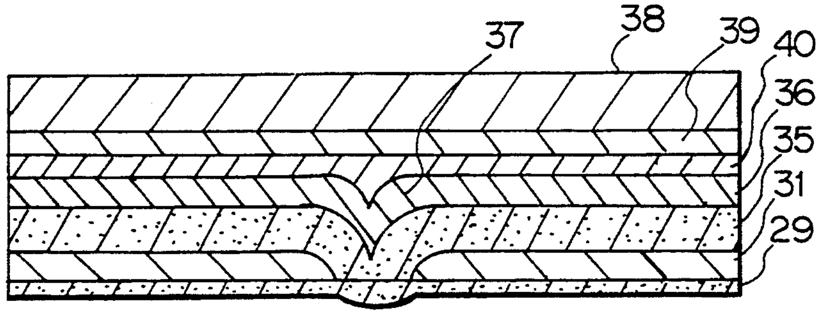

The fourth step of this method is shown in FIG. 5D. Silicon is completely removed from the reverse side of the silicon substrate 30, by etching with an aqueous solution of potassium hydroxide. The first silicon oxide layer 29 cannot be properly etched with the aqueous solution of potassium hydroxide.

Figure 5E:
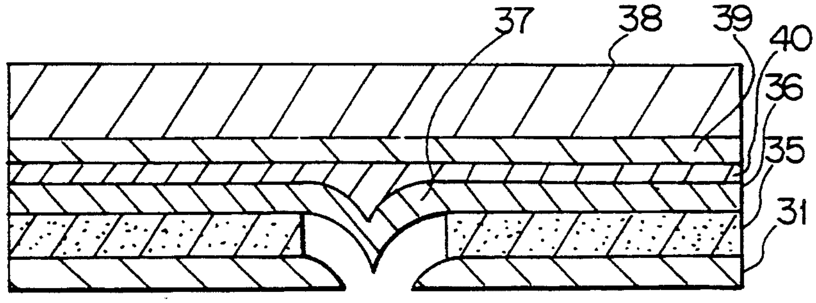

The fifth step of this method is shown in FIG. 5E. Both a first silicon oxide layer 29 and the second silicon oxide layer 35 above the cathode 37 are removed with an aqueous solution of hydrofluoric acid, to thereby expose the gate electrode 31 and cathode 37, whereby the cathode is produced.

In this example, the distance between the gate electrode 31 and cathode 37 is adjusted by the thickness of the second silicon oxide layer 35, and the positional relationship between the tip areas of the gate electrode 31 and cathode 37 is controlled by both the width of the opening 33 in the silicon nitride layer 32 and the thickness of the second silicon oxide 35. As a result, the gate electrode 31 can be located in the vicinity of the cathode 37 with a high accuracy, thereby ensuring a high reproducibility in the production of a cathode having a low electron emission voltage with a highly limited tolerance.

EXAMPLE 3

The method of manufacturing a cathode in the third embodiment of this invention is now described. FIGS. 6A to 6E show a cathode element section for elucidation of the method of the third embodiment.

Figure 6A:
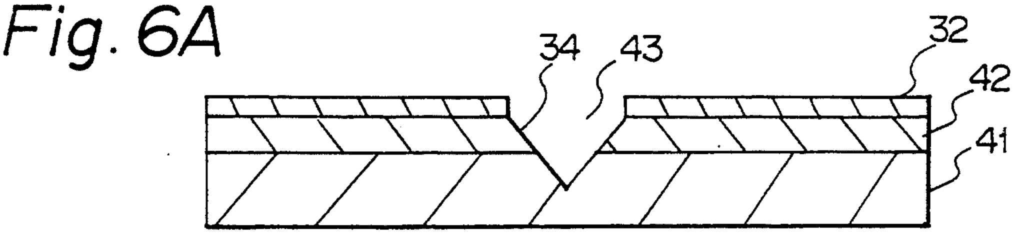
FIGS. 6A–6E are section views illustrative of a process according to a third embodiment of the present invention.

FIG. 6A shows the element in the first step. An application agent for diffusing phosphorus is applied to a p-type (100) silicon substrate 41, which is baked for 30 min. at 150° C. in a nitrogen atmosphere and then heated for diffusion at 900° C. for 1 hr. in a nitrogen atmosphere, whereby an n-type conductive layer 42 having a thickness of 0.5 μm is obtained. Subsequently, a silicon nitride layer 32 is deposited by the LPCVD method, and a first opening 43 of 2 μm square area is further formed by photolithography. The silicon substrate 41 is etched with an aqueous solution of potassium hydroxide through the first opening 43. This etching is stopped when the (111) surfaces 34 first appear, because the etching speed is extremely low for the (111) surfaces.

Figure 6B:
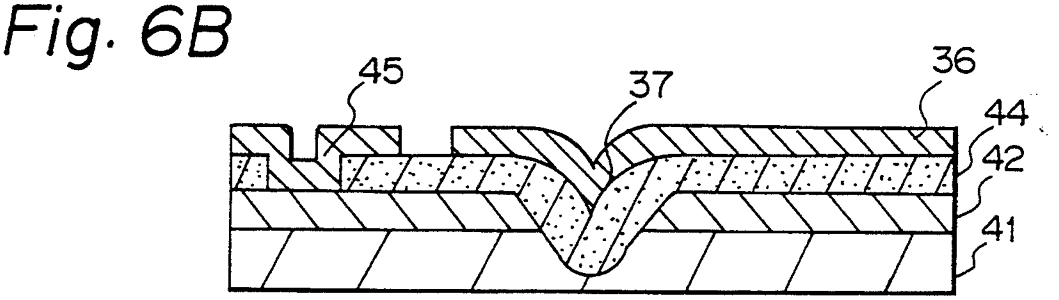

The second step of this method is shown in FIG. 6B. After the etching, the silicon nitride layer 32 is completely removed with a phosphoric solution heated to approx. 150° C. Subsequently, the silicon substrate 41 is oxidized in a steam atmosphere at 1000° C., to form a silicon oxide layer 44 having a thickness of 0.5 μm, and then a second opening 45 of 1 μm square is formed in the silicon oxide layer 44 by photolithograpy. By using the vacuum evaporation method, a tungsten layer 36 having a thickness of 1 μm is further deposited to form a cathode 17, and subsequently, the tungsten layer is patterned by photolithograpy to separate the tungsten layer 45 on the n-type conductive layer 42 from the tungsten layer 36 of the cathode 37, to thereby electrically insulate the layers from each other.

Figure 6C:
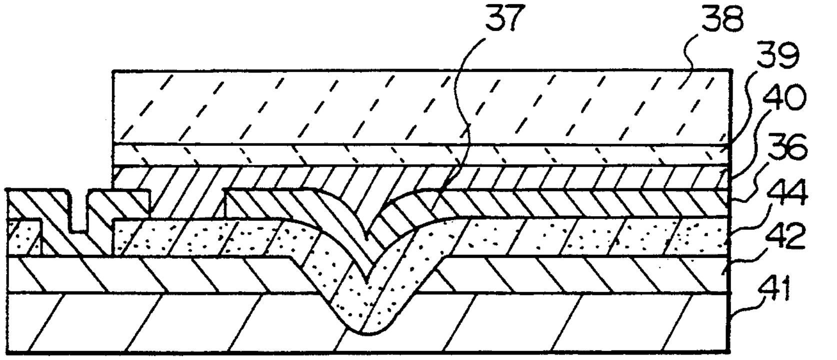

The third step of this method is shown in FIG. 6C. A transparent conductive layer (ITO layer) 39 having a 1 μm thickness is deposited on a glass substrate 38 by the vacuum evaporation method, and the conductive layer 39 on the glass substrate 38 is bonded to the tungsten layer 36 on the silicon substrate 30 with a silver-epoxy resin 40.

Figure 6D:
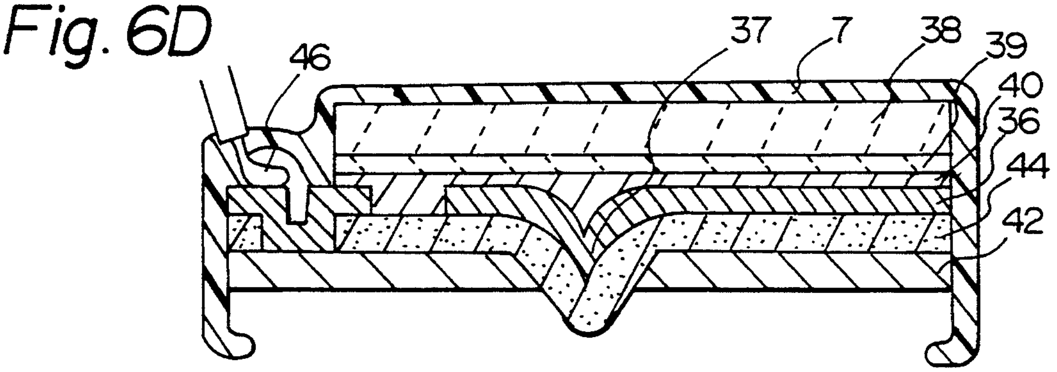

The fourth step of this method is shown in FIG. 6D. A lead wire 46 covered with an alkali-inactive material, such as vinyl, is applied via a silver paste to the tungsten layer 45 on the n-type conductive layer 42, and at the same time, the whole surface and all sides of both the glass substrate 38 and silicon substrate 41 are covered with a guard film 7 which cannot be affected by an aqueous alkaline solution. The silicon substrate 41 to which the lead wire 46 is bonded is immersed, together with a platinum electrode, in an aqueous 40% potassium hydroxide solution at a temperature of 85° C., and a positive potential of about 1 V is applied to the lead wire 46 relative to the platinum electrode, to thereby enable the silicon substrate 41 to be etched electrochemically. In the progress of etching the silicon substrate 41, the n-type conductive layer 42 is exposed and immediately anodized, thus stopping the etching. In this process, the p-type silicon is completely removed and only the n-type conductive layer 42 remains. After the etching, the substrate is immersed in a heated trichloroethylene to remove the guard film 7 and lead wire 46.

Figure 6E:
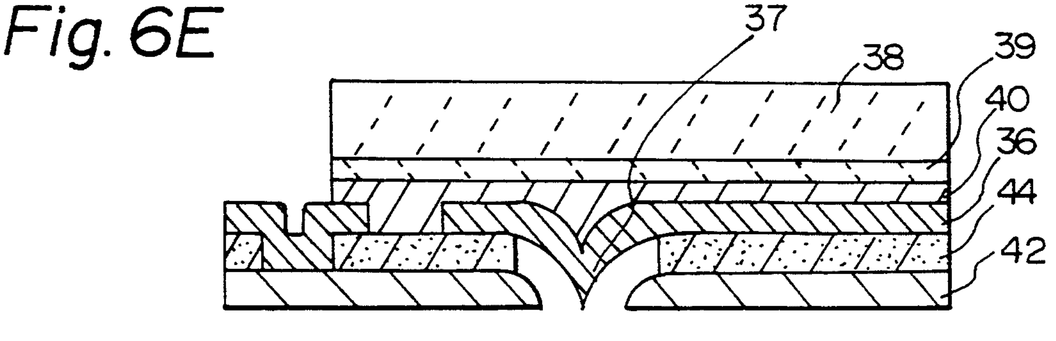

The final step of this method is shown in FIG. 6E. The cathode is produced by removing the silicon oxide layer 44 above the cathode 37, whereby the cathode 37 is exposed.

In this example, the distance between the gate electrode 42 and cathode 37 can be adjusted by the thickness of the silicon oxide 44, and the spatial relationship between the gate electrode 42 and the tip of the cathode 37 is controlled by the thickness of the n-type conductive layer 42 produced by an impurities doping method, such as a thermal diffusion method, an ion implantation method or the like, the width of the first opening 43 in the silicon nitride layer 32, and the thickness of the silicon oxide 44. The gate electrode 42 also can be located at a very small distance from the cathode 37, with a desired accuracy. Consequently, a cathode having a low electron emission voltage with a high reproducibility at a desired tolerance is obtained.

EXAMPLE 4

The method of manufacturing a microtriode in the fourth embodiment of the present invention is now described.

Figure 7:
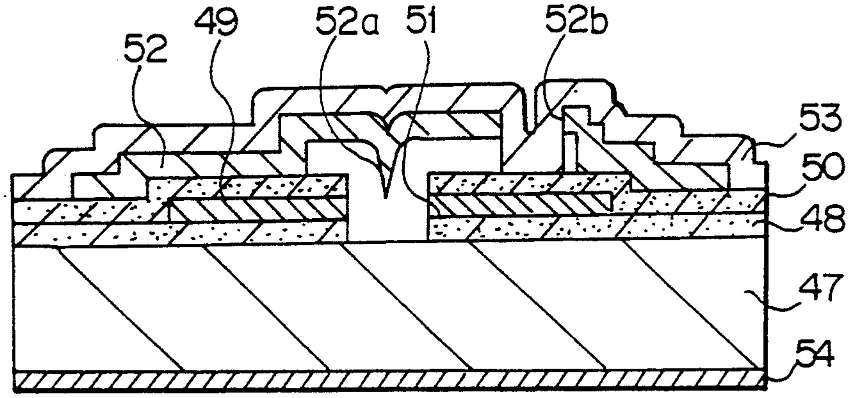
FIG. 7 is a section view of a field-emitter element illustrative of a fourth embodiment of the present invention.

FIG. 7 shows a section of a microtriode. The substrate 47 can be selected from various materials, for example, a metal-coated substrate of a glass, ceramics or the other like. Moreover, a patterned metal film of the coated substrate also can be used, because the substrate must be conductive, but need not be entirely made of conductive materials. In this example, an n-type (001) silicon single crystal having a specific resistivity of 0.8 to 1.2 Ωcm is used.

The thickness of the silicon oxide layer 48 is such that the operating voltage applied between gate layer 49 (described later) and substrate 47 as an anode electrode does not exceed the specific break-down voltage. In this example, the thickness of the silicon oxide layer 48 is 500 nm; a silicon nitride layer may be used instead of the silicon oxide layer 48.

The gate layer 49 must not be affected by an aqueous solution of hydrofluoric acid used to etch the silicon oxide layers 56 and 58, as described later. The gate layer 49 used is a polysilicon layer having a thickness of approx. 300 nm.

The silicon nitride layer 50 serves as an insulating film between the gate layer 49 and cathode 52a (described later), and the film thickness thereof must be selected to be more than that corresponding to the critical insulating voltage between the gate layer 49 and cathode *52a*. In this example, the thickness of the silicon nitride layer 50 is about 500 nm.

An opening 51 in the silicon oxide layer 48, gate layer 49 and silicon nitride layer 50 is used to form the cathode, later described, and the size of the opening satisfies the optimum conditions of the spatial relationship between a gate electrode 49 and cathode *52a*, as well as the procedures of the whole processes. The optimum shape of the opening 51 must be experimentally determined, because it is an important factor in determining the shape of the cathode *52a*. In this example, an opening 2 μm square is formed.

A conductive layer 52 above the opening 51 serves as the cathode *52a*, and the conductive layer other than the area of the cathode *52a* is used as an electrode for the cathode *52a*. The conductive layer 52 must be prepared from a material having a small work function, since a greater amount of electrons emitted must be obtained from the cathode *52a*. Also, the material must not be affected by the aqueous solution of hydrofluoric acid used to etch the silicon oxide, as described later.

In this example, a molybdenum layer having a thickness of 1 μm is used as the conductive layer 52, but a metal carbide, metal boride or the like also can be used as the conductive layer 52.

Etching holes *52b* are used to remove the silicon oxide layers 56 and 58 (FIG. 8G) for the mold of the cathode used in the etching process. The size and number of the holes *52b* must allow an easy exchange of etching solutions. In this example, two etching holes *52b* having an area 3 μm square are disposed symmetrically apart from the center of the opening 51 by 5 μm.

The guard film 53 provided for passivation and vacuum encapsulation is preferably prepared in a high vacuum and in a stress-free state, to avoid, for example, cracks through which the vacuum will be lost. The thickness of the guard film 53 must be able to stop the holes *52b* formed in the conductive layer 52 of the cathode. In this example, a silicon oxide layer having a thickness of 2 μm, corresponding to guard film 53, is prepared by the sputtering method.

When an n-type silicon single crystal substrate is used as the substrate 47, a back contact electrode 54 of the substrate 47, which is used as an anode electrode, is prepared, e.g., from the double metallic layer of a 150 nm thickness indium and 300 nm thick gold, to obtain an ohmic contact with the n-type silicon single crystal substrate. When, however, an insulating substrate (e.g., glass) on which a metallic layer is deposited is used as a substrate 47, the ohmic contact can be obtained from the surface, and it is not necessary to form such a back contact electrode 54.

The method of manufacturing a microtriode is now described with reference to FIGS. 8A to 8H.

Figure 8A:
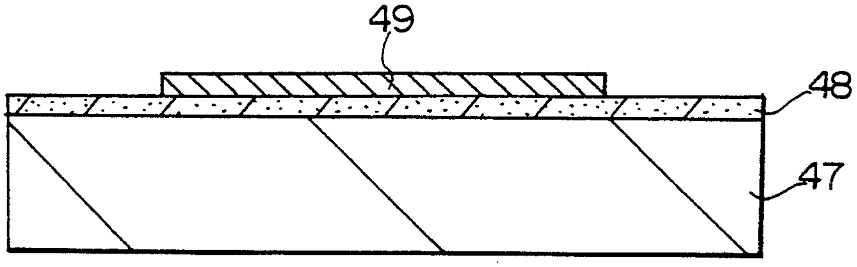
FIGS. 8A–8H are section views illustrative of the process for developing the fourth embodiment.

In the initial step, a silicon oxide layer 48 is deposited on the whole surface of a substrate 47, for example, a silicon single crystal substrate, by thermal oxidation, sputtering, low pressure CVD (LPCVD), plasma CVD, or the like, as shown in FIG. 8A.

In the next step, a gate layer 49 is deposited on the whole surface of the silicon oxide layer 48 by LPCVD, sputtering or the like. Thereafter, the gate layer 49 is given a predetermined pattern by photolithography and etching, to obtain an electrical connection with the external electrode for a later examination of the electrical properties of the triode. Note when such an examination is required, a patterning of the gate layer 49 is not necessary.

Figure 8B:
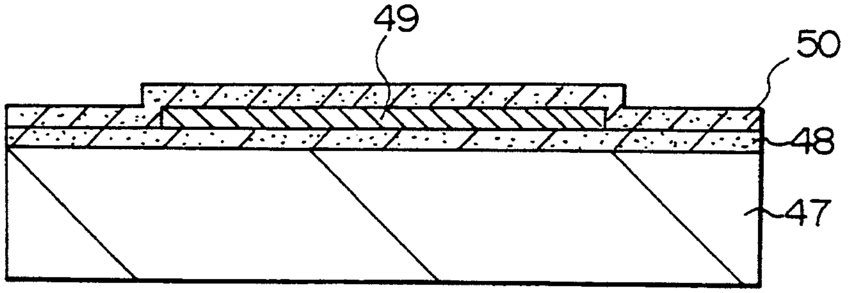

In the next step, a silicon layer 50 is deposited on the whole surface of the substrate by LPCVD, sputtering or the like, as shown in FIG. 8B.

Figure 8C:
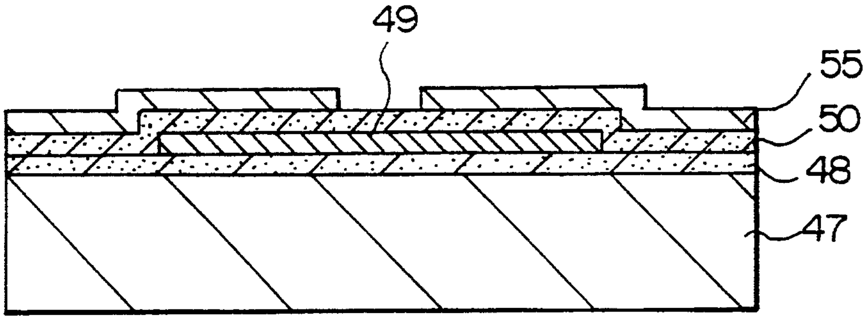

In the next step, a resist pattern having an opening corresponding to an opening for forming a cathode is formed on the silicon nitride layer 50 by lithography, as shown in FIG. 8C.

Figure 8D:
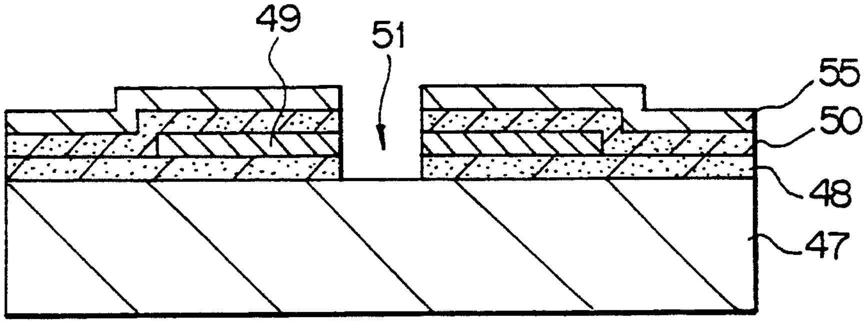

In the next step, the silicon nitride layer 50, gate layer 49 and silicon oxide layer 48 are successively etched using the resist pattern 55 as a mask, by etching, e.g., reactive ion etching (RIE), and an opening 51 is formed therein, as shown in FIG. 8D.

Figure 8E:
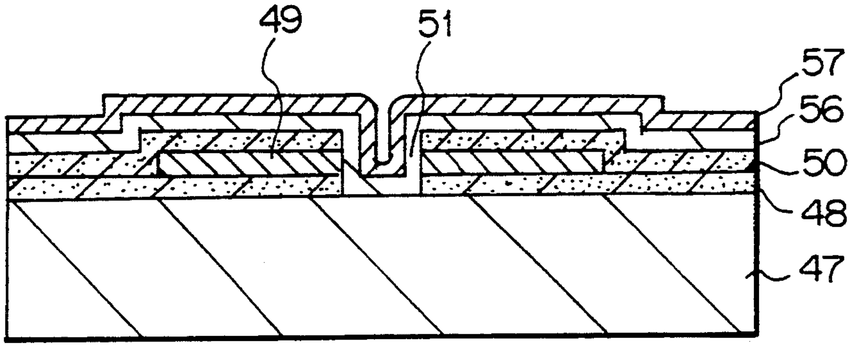

In the next step, the resist pattern 55 is removed, and then a silicon oxide layer 56 is formed on the whole surface of the substrate by a depositing method, e.g., sputtering method, LPCVD method or the like, as shown in FIG. 8E. This silicon oxide layer 56 is used as a guard film for the gate layer 49, which is exposed towards the side portions of the opening 51 in the later process for oxidizing the silicon layer 57. Therefore, the thickness of the silicon oxide layer 56 must be an optimum amount, to ensure that oxidizable components under the oxidization reaction condition do not reach the gate layer 49 during the oxidizing process. In this example, the thickness of the silicon oxide layer 56 used is approx. 500 nm.

In the next step, a silicon layer 57, such as a polysilicon layer or amorphous silicon layer, is deposited over the entire surface of the substrate by e.g., a CVD method. The thickness of the silicon layer 57 is optimally determined in accordance with the lateral size and depth of the opening 51. In practice, it is determined so that it does not fill the opening 51 in the form of the inverse cone with the silicon oxide when the silicon layer 57 is oxidized, as described later. In this example, the thickness of the silicon layer 57 used is approx. 500 nm.

Figure 8F:
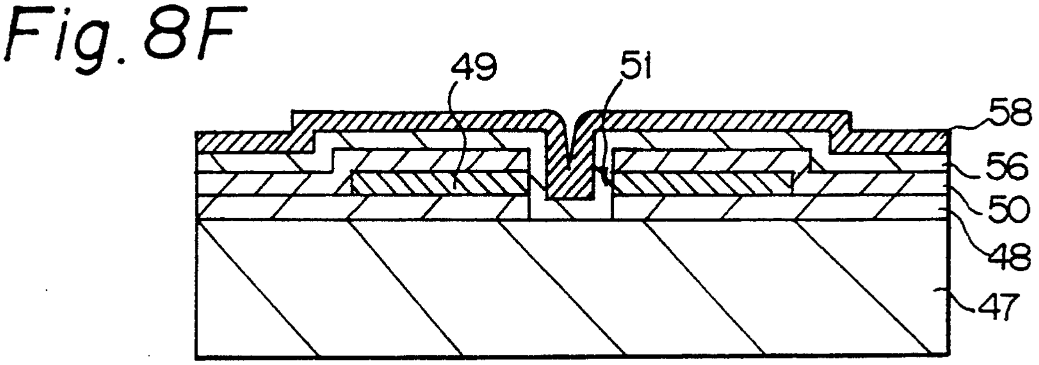

In the next step, the silicon layer 57 is thermally oxidized to form a silicon oxide layer 58, as shown in FIG. 8F. The oxidization is performed for 20 min. by a burning oxidization process at 1100° C. In this case, the oxidizing speed is delayed due to the increased stress of growing silicon oxide layer 58 at the tip end of the inverse cone of the opening 51. As a result, the end portion of the tip is sharper, and this sharper hole in the silicon oxide layer 58 can be used as the mold for forming the cathode.

Figure 8G:
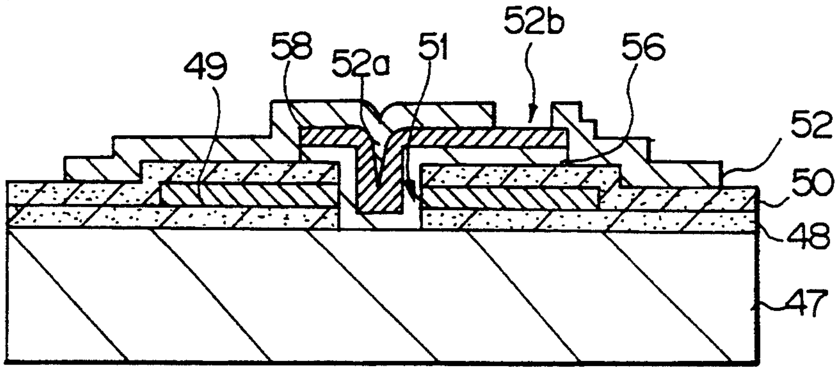
Figure 8H:
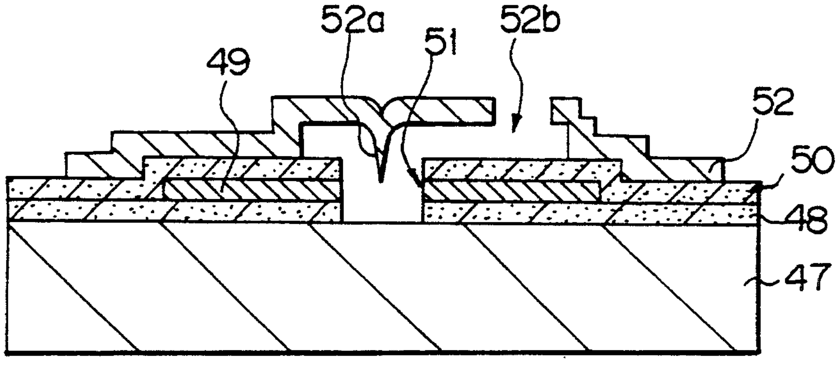

In the next step, the silicon oxide layers 56 and 58 are formed into a pattern such that only an area of the layers including the opening 51, where a sacrificing layer for the later process is formed, remains as shown in FIG. 8G. The size of the area of the sacrifying layer must be determined such that the etching hole **52*b* (described later) are connected to the opening 51** after the removing of the sacrificing layer.

In the next step, a conductive layer 52 which forms the cathode and electrode is deposited on the whole surface of the substrate by electron beam (EB) evaporation, sputtering or the like, and thereafter, the conductive layer 52 is formed into a predetermined pattern. This is performed in such a way that the conductive layer 52 completely covers the silicon oxide layers 56 and 58 at the area of the above-described sacrificing layer. Subsequently, the etching hole **52*b* is formed in the conductive layer 52** by photolithography and etching.

In the next step, the substrate is etched through the etching hole **52*b* of the conducive layer 52 used as a mask with an aqueous solution of hydrofluoric acid, to thereby completely remove the sacrificing layer (silicon oxide layers 56 and 58), as shown in FIG. 8**H.

In the next step, a guard film 53 of, e.g., silicon oxide layer, is formed by sputtering, EB evaporation or the like to obtain a vacuum seal and passivation, as shown in FIG. 7. Thereafter, a back contact electrode 54 is formed on the back of the substrate 47 by depositing materials, such as indium and gold, by evaporation. A result, the production of the microtriode of the present invention is completed.

As mentioned above, according to this embodiment, an inverse cone shaped hole having an extremely sharp tip is produced inside the opening 51 of the silicon oxide layer 58 formed by thermally oxidizing the silicon layer 57, and a cathode **52*a* can be produced by using the hole as a mold for the cathode. In addition, the cathode 52*a*** can be prepared from metallic materials or metal carbides having a very high electron emission efficiency. As a result, microtriodes having excellent properties can be produced by the above-mentioned process of producing a cathode having an extremely enhanced electron emission efficiency.

In summary, the field-emitter cathode of this invention provides a reduction in both the electron emission voltage and the electrical resistivity of the main body of the cathode, and accordingly, provides a lower energy of the emitted electrons and avoids the following drawbacks: desorption of molecules absorbed in the electrode material of the anode or vaporization of atoms in the electrode material due to the bombardment of high energy electrons; damage to or destruction of the cathode due to a discharge caused by a collision of high energy electrons with gaseous molecules; desorption of absorbed molecules from the cathode due to heating; and deformation of and/or damage to the cathode tip. Moreover, the stability of the electrical properties and the service life of the field-emitter element is enhanced.

The method of manufacturing field-emitters according to the present invention provides a highly reproducible production method of obtaining the cathode, regarding the shape and sharpness of the tip, since the cathode is produced by an etching technique based on anisotropic etching and oxidation of the silicon. Furthermore, the spacing between the gate electrode and cathode is controlled by the thickness of the silicon oxide layer, and the spatial relationship between the gate electrode and the tip of the cathode is controlled by the silicon oxide layer embedded in the substrate, by an etching stop technique based on an electrochemical etching. Consequently, the gate electrode can be disposed with high accuracy at a position very close to the cathode, thereby making it possible to produce microtriodes having a low electron emission voltage and high reproducibility. In addition, metals or metal carbides having an excellent electron emission efficiency can be employed as a cathode material suitable for the field-emitter.

We claim:

1. A method of manufacturing a vacuum microelectronic triode device, said method comprising the steps of:

(a) providing a substrate having a silicon layer at least adjacent to a top surface of the substrate, the silicon layer having a top surface;

(b) forming a recess in the silicon layer from the top surface thereof, said recess having a cross section, the sides of which intersect and form a sharp point at a bottom thereof, the silicon layer having a surface in the recess;

(c) oxidizing a portion of the silicon layer in the recess to form a first silicon oxide layer on the surface of the recess of the silicon layer;

(d) etching the silicon layer surrounding the first silicon oxide layer to a depth shallower than a depth of the bottom of the first silicon oxide layer, the etched silicon layer having a second top surface;

(e) oxidizing the second surface of the silicon layer to form a second silicon oxide layer;

(f) depositing a first electrically conductive layer on the first and second silicon oxide layers;

(g) depositing a third silicon oxide layer on the first electrically conductive layer;

(h) etching a portion of the third silicon oxide layer above said recess to form a first opening of the third silicon oxide layer on the first electrically conductive layer;

(i) depositing a second electrically conductive layer in the first opening and on the third silicon oxide layer;

(j) etching a portion of the second electrically conductive layer to form a second opening in the second electrically conductive layer on the third silicon oxide layer remote from the first opening;

(k) etching a portion of the third, first and second silicon oxide layers through the second opening to expose the first electrically conductive layer including the sharp point thereof in said recess; and (l) closing the second opening with a protective layer under a vacuum.

2. A method of manufacturing a field emitter cathode having a sharp point at a tip thereof, said method comprising the steps of:

(a) providing a substrate;

(b) forming a stack of a first insulating layer, a first electrically conductive layer and a second insulating layer, in this order, on the substrate;

(c) forming an opening in said stack to expose the substrate;

(d) depositing a silicon layer in the opening and on the second insulating layer;

(e) oxidizing the silicon layer to form a silicon oxide layer having a recess, the sides of which recess 10 intersect and form a sharp point at the bottom thereof;

(f) depositing a second electrically conductive layer on the silicon oxide layer, the second electrically conductive layer having a sharp point in the recess of the silicon oxide layer; and (g) removing at least a portion of the silicon oxide layer to expose the sharp point of the second electrically conductive layer.

3. A method of manufacturing a vacuum microelectronic triode device, said method comprising the steps of:

(a) providing a silicon substrate;

(b) forming a stack of a first insulating layer, a first electrically conductive layer and a second insulating layer, in this order, on the silicon substrate;

(c) forming a first opening in said stack to expose the substrate;

(d) depositing a silicon layer in the first opening and on the second insulating layer;

(e) oxidizing the silicon layer to form a silicon oxide layer having a recess, the sides of which recess intersect and form a sharp point at the bottom thereof;

(f) patterning the silicon oxide layer to leave a portion of the silicon oxide layer including an area on the first opening and to expose a portion of the second insulating layer;

(g) depositing a second electrically conductive layer on the patterned silicon oxide layer and the exposed second insulating layer, the second electrically conductive layer having a sharp point in the recess of the silicon oxide layer;

(h) forming a second opening in the second electrically conductive layer remote from the first opening;

(i) etching and removing the silicon oxide layer through the second opening to expose the sharp point of the second electrically conductive layer; and (j) closing the second opening with a protective layer in a vacuum.

* * * * *